(12) United States Patent
Nakano et al.

(10) Patent No.: US 6,275,444 B1
(45) Date of Patent: Aug. 14, 2001

(54) SEMICONDUCTOR INTEGRATED CIRCUIT

(75) Inventors: Takeshi Nakano, Osaka; Kazunari Takahashi, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/255,779

(22) Filed: Feb. 23, 1999

(30) Foreign Application Priority Data

Feb. 24, 1998 (JP) .................................................. 10-042118

(51) Int. Cl.[7] ...................................................... G11C 8/00
(52) U.S. Cl. ............................................................ 365/233
(58) Field of Search .............................. 365/233, 189.05, 365/189.07, 189.08

(56) References Cited

U.S. PATENT DOCUMENTS 5,991,232 * 11/1999 Matsumura et al. .................. 365/233
6,141,265 * 10/2000 Jeon ...................................... 365/233
6,215,725 * 4/2001 Komatsu .............................. 365/233

FOREIGN PATENT DOCUMENTS 6-187797    7/1994 (JP) .

* cited by examiner

*Primary Examiner*—Trong Phan
(74) *Attorney, Agent, or Firm*—Eric J. Robinson; Nixon Peabody LLP

(57) ABSTRACT

A semiconductor integrated circuit is disclosed which includes a clock synchronous memory, an internal clock generating circuit, a clock selecting circuit, a data output converting circuit, and a data output selecting circuit. The clock synchronous memory is disposed to receive a control signal, an address signal, and a data input and provide an internal data output. The internal clock generating circuit is disposed to generate an internal clock signal having a frequency higher than that of an external clock signal. The clock selecting circuit is disposed to select between the external clock signal and the internal clock signal and send the selected clock signal to the clock synchronous memory. The data output converting circuit is disposed to convert the internal data output into an external data output in synchronization with a clock signal having a frequency lower than that of the internal clock signal. The data output selecting circuit is disposed to select between the internal data output and the external data output and provide the selected data output.

9 Claims, 8 Drawing Sheets

Fig. 5

| ICLK2/IDOUT LEVEL COMPARISON RESULTS | | IN SECOND-HALF PERIOD OF ICLK2 | |
|---|---|---|---|
| | | MATCH | MISMATCH |
| IN FIRST-HALF PERIOD OF ICLK2 | MATCH | DOUT= "0" | DOUT= "Hi-Z" |
| | MISMATCH | DOUT= "Hi-Z" | DOUT= "1" |

SEMICONDUCTOR INTEGRATED CIRCUIT

BACKGROUND OF THE INVENTION

The present invention relates to a semiconductor integrated circuit (i.e., a semiconductor device) testable by a test system even when the semiconductor integrated circuit operates faster than the test system.

A test technique, called dynamic burn-in testing, for accelerating the aging of semiconductor devices has been known in the art. The purpose of a dynamic burn-in test operation is to remove or screen out devices that are subject to time and stress-dependent failures. More specifically, such a screening-out operation is carried out by applying a supply voltage in excess of the rated voltage to a test-target device at constant temperature while applying to the device an input signal similar to one that is applied in the normal operation. A monitored burn-in system has, in addition to a dynamic burn-in function, a device output monitoring/observing function.

With the speed-up of the operation of semiconductor devices, their maximum operation frequency has increased. Japanese Unexamined Laid-Open Patent Application Publication No. 6-187797 discloses a technique. In accordance with the 6-187797 technique, in order to enable a slow test system to perform testing of a fast memory device, the frequency of an external clock signal is increased in the inside of the memory device for generating an address signal in synchronization with an internal clock signal having the increased frequency. However, the 6-187797 technique makes no disclosure of the monitoring of device output.

In accordance with the monitored burn-in system described above, the monitoring of the output of the device is repeatedly carried out at given time intervals. However, during the device output monitoring, there occurs a drop in voltage stress because the supply voltage of the device is lowered down to the rated voltage. Accordingly, there has been strong demand for reductions in the time required for each monitoring operation. To satisfy such demand, the devices are required to operate at a high speed as required in their normal operation if they are capable of high-speed operation, even during the device output monitoring under burn-in testing. However, because of the various limits of test systems, the devices, although they have the capability of operating at a high speed, are practically forced to operate at a lower speed during the device output monitoring under burn-in testing.

The operation of monitoring device outputs is indispensable also to functional testing of high-speed devices. However, such a device output monitoring operation has been beyond the capability of a low-speed test system.

SUMMARY OF THE INVENTION

Accordingly, an object of the present invention is to make it possible for a slow-speed test system to perform monitoring of the output of a high-speed device.

In order to achieve the object, in the present invention, the variation frequency that the output of a high-speed device varies is lowered in the inside of the device, whereby a signal, whose variation frequency is low, can be provided from the device.

In one aspect, it is a feature of the present invention to provide a first semiconductor device that employs a configuration comprising (a) a functional circuit for providing, in synchronization with a clock signal, data at a first frequency, (b) data holding means for performing a data take-in/hold operation so that in a first period of cycles having the first frequency within one period of cycles having a second frequency lower than the first frequency, first data is taken in from the functional circuit and held in the data holding means, (c) data taking-in means for taking in, from the functional circuit, second data in a second period of the cycles having the first frequency posterior to the first cycle within the period of cycles having the second frequency, and (d) data output converting means for generating, based on the first data held in the data holding means and the second data taken in by the data taking-in means, third data and for providing the third data at the second frequency. By virtue of the configuration described above, of the data outputs from the functional circuit at the first frequency, the first data in one period of the first frequency and the second data in another period of the first frequency are provided to the data output converting means. The data output converting means generates, based on both the first data and the second data, the third data and provides it at the second frequency lower than the first frequency. This accordingly enables even a slow test system to monitor the output of the device. In order for the test system to perform a device output monitoring operation with efficiency, the data output converting means performs a data conversion operation so that the number of states assumable by the third data falls below the number of all possible combinations of states assumable by the first data and states assumable by the second data.

In another aspect, it is a feature of the present invention to provide a semiconductor integrated circuit having a normal operation mode and a test mode. This semiconductor integrated circuit employs a configuration comprising (a) a functional circuit for providing a two-valued logic signal which varies at a predetermined variation frequency, (b) a converting circuit for converting the two-valued logic signal supplied from the functional circuit into a multiple-valued logic signal which varies at a less variation frequency than that of the two-valued logic signal, and (c) an output selecting circuit for selecting between the two-valued logic signal and the multiple-valued logic signal, wherein when the semiconductor integrated circuit is in the normal operation mode, the output selecting circuit selects the two-valued logic signal as a signal to be provided from the semiconductor integrated circuit and wherein when the semiconductor integrated circuit is in the test mode, the output selecting circuit selects the multiple-valued signal as a signal to be provided from the semiconductor integrated circuit. The foregoing multiple-valued logic signal is a three-valued logic signal having, in addition to a high voltage level state representative of a logical value of 1 and a low voltage level state representative of a logical value of 0, a high impedance state representative of a third logical value. The configuration described above makes it possible for even a slow test system to monitor the output of the device. In addition, the amount of information transferable by multiple-valued logic signals per unit time in the test mode (a first information rate) can be increased to such an extent that the first information rate equals a second information rate (the amount of information transferable by two-valued logic signals per unit time in the normal operation mode). It is however possible to select how many logic value levels a multiple-valued logic signal should assume and how frequently it should vary so that the second information rate falls below the first information rate.

BRIEF DESCRIPTION OF THE DRAWINGS

FIG. 5 is a diagram for describing the output of the data output converting circuit of FIG. 3.

DETAILED DESCRIPTION OF THE INVENTION

The present invention discloses semiconductor integrated circuits which will be described by referring to the attached drawings. The following description is directed to example applications of the present invention in which the present invention is applied to clock synchronous DRAMs (dynamic random access memories) such as synchronous DRAMs.

Figure 1:
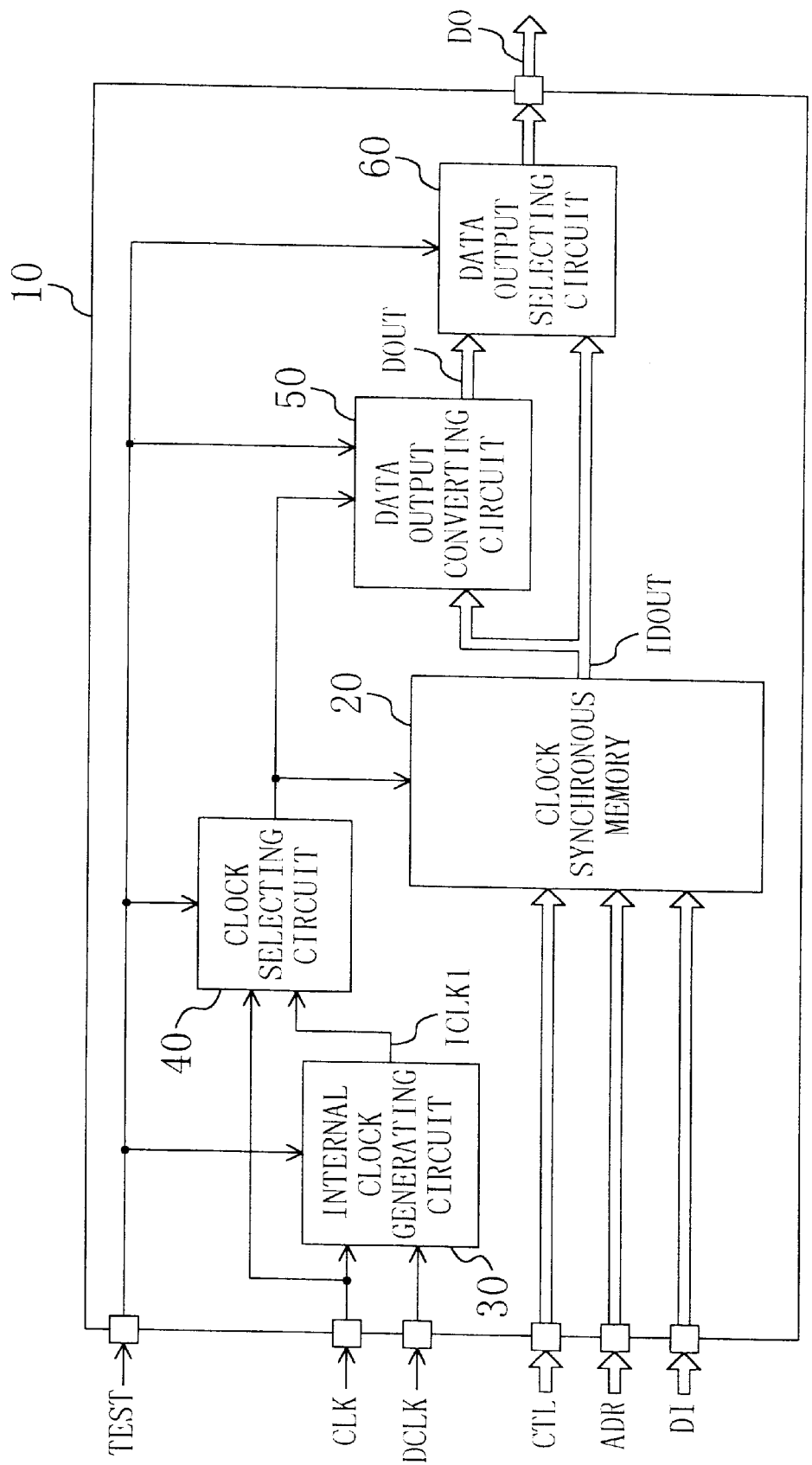
FIG. 1 is a block diagram showing an example structure of a semiconductor integrated circuit in accordance with the present invention.

Referring first to FIG. 1, there is shown an example structure of a semiconductor integrated circuit (a semiconductor device) of the present invention. Referring still to FIG. 1, a semiconductor device 10 having a conventional clock synchronous memory 20 is illustrated. The clock synchronous memory 20, which is a functional circuit, receives from the outside of the device 10 a control signal CTL, an address signal ADR, and a data input DI. In addition to the external information (CTL, ADR, and DI), the clock synchronous memory 20 further receives either an external clock signal CLK or an internal clock signal ICLK1 via a clock selecting circuit 40. Based on the information received (CTL, ADR, DI, and CLK (or ICLK1)), the clock synchronous memory 20 operates and provides an internal data output IDOUT. An internal clock generating circuit 30, which is a circuit means, responds to a test control signal TEST delivered from the outside of the device 10 by generating, during testing, the internal clock signal ICLK1 on the basis of the external clock signal CLK and a delayed external clock signal DCLK both generated by a test system. A clock selecting circuit 40, which is a circuit means, responds to the test control signal TEST by selecting between the internal clock signal ICLK1 and the external clock signal CLK delivered from the outside of the device 10 and by providing either the internal clock signal ICLK1 or the external clock signal CLK, whichever was selected, to the clock synchronous memory 20. A data output converting circuit 50, which is a circuit means, responds to the test control signal TEST by converting the internal data output (two-valued logic signal) IDOUT which is variable at a predetermined variation frequency, into an external data output (three-valued logic signal) DOUT which is variable at a less variation frequency than the two-valued logic signal. More specifically, based on the internal data output IDOUT provided from the clock synchronous memory 20 in synchronization with the internal clock signal ICLK1, the data output converting circuit 50 generates the external data output DOUT in synchronization with the external clock signal CLK or in synchronization with a clock signal equivalent to the external clock signal CLK. A data output selecting circuit 60, which is a circuit means, responds to the test control signal TEST by selecting between the external data output DOUT and the internal data output IDOUT and by providing, as a data output DO, either DOUT or IDOUT, whichever was selected, to the outside of the device 10.

The operation of the semiconductor device 10 of FIG. 1 is now described. In the normal mode operation of the semiconductor device 10, the external clock signal CLK is sent unaltered to the clock synchronous memory 20 through the clock selecting circuit 40. The internal data output IDOUT provided from the clock synchronous memory 20 in synchronization with the external clock signal CLK is sent unaltered to the outside of the semiconductor device 10 through the data output selecting circuit 60, as the data output DO.

Referring to FIGS. 1–5, the operation of the semiconductor device 10 is described in which a low-speed test system is used to perform testing of the semiconductor device 10.

Figure 2:
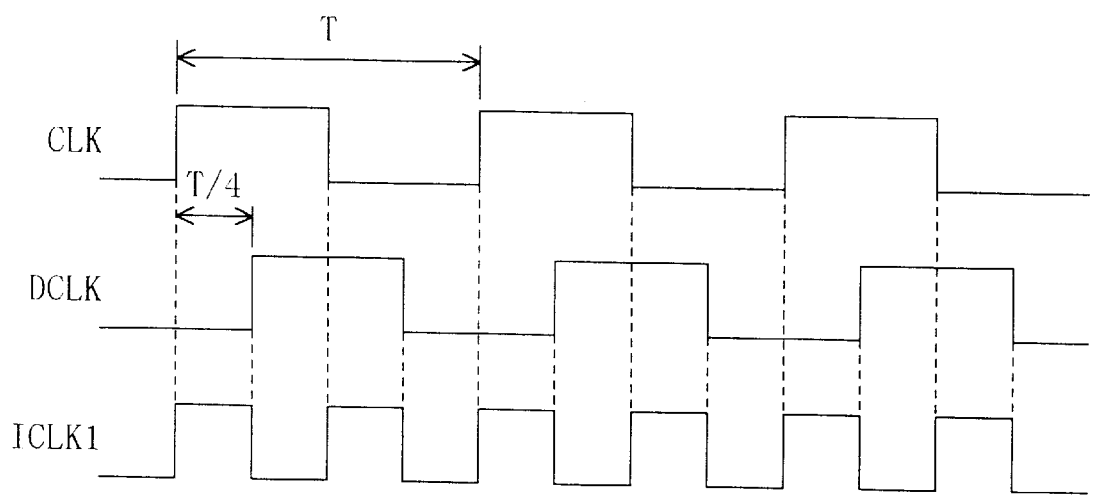
FIG. 2 is a timing chart diagram showing the operation of an internal clock generating circuit of FIG. 1.

FIG. 2 shows the operation of the clock generating circuit 30 of FIG. 1. As shown in FIG. 2, the test system generates the external clock signal CLK having a cycle T and the delayed external clock signal DCLK which is delayed in phase by T/4 with respect to CLK. As shown in FIG. 1, these clock signals CLK and DCLK are delivered to the test-target semiconductor device 10. In FIG. 1, during the testing, the test control signal TEST is made active. Because of this, the internal clock generating circuit 30 generates, based on the clock signals CLK and DCLK received, the internal clock signal ICLK1 by means of EXOR (exclusive-OR) logic. As shown in FIG. 2, the frequency of the internal clock signal ICLK1 is twice that of the external clock signal CLK generated by the test system to the device 10.

The internal clock signal ICLK1 generated in the internal clock generating circuit 30 is delivered to the clock synchronous memory 20 via the clock selecting circuit 40. Accordingly, the clock synchronous memory 20 outputs the internal data output IDOUT in synchronization with the internal clock signal ICLK1 whose frequency is twice that of the external clock signal CLK. If the internal data output IDOUT as output from the clock synchronous memory 20 is tested with the test system, this results in the requirement that the operation frequency of the test system be twice that of the external clock signal CLK. Arrangement is therefore required to be made so that (i) the internal clock signal ICLK1, whose frequency is twice that of the external clock signal CLK, is used to operate the clock synchronous memory 20 and (ii) the operation result of the clock synchronous memory 20 is made testable by the test system operating at the same rate as the external clock signal CLK. To this end, the device 10 of the present embodiment is provided with the data output converting circuit 50 operable to degenerate the internal data output IDOUT in time axis direction.

Figure 3:
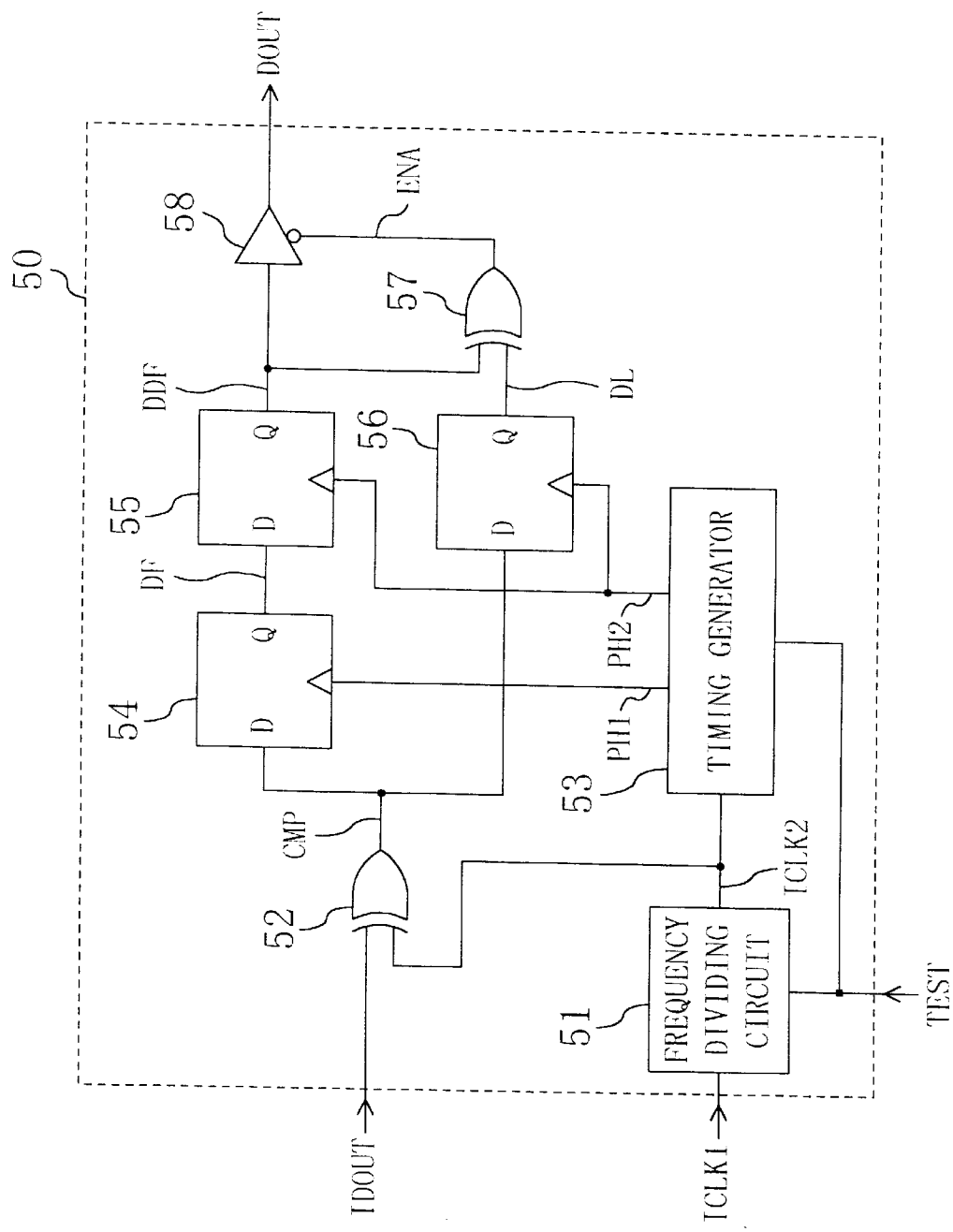
FIG. 3 is a circuit diagram showing in detail an example structure of a data output converting circuit of FIG. 1.

FIG. 3 illustrates in detail an example structure of the data output converting circuit 50 of FIG. 1. In FIG. 3, a frequency-dividing circuit 51, which is a circuit means, is controlled by the test control signal TEST. The frequency-dividing circuit 51 receives and frequency-divides the internal clock signal ICLK1 to generate a frequency-divided (FD) internal clock signal ICLK2 having a frequency one-half that of the received internal clock signal ICLK1 (in other words, the period of ICLK2 is twice that of ICLK1). An EXOR circuit 52, which a comparing means, provides a compare result signal CMP representative of the exclusive OR of IDOUT and ICLK2. A timing generator 53, which is a circuit means, is controlled by the test control signal TEST and generates first and second timing signals PH1 and PH2 which are delayed by respective predetermined lengths of time with respect to the FD internal clock signal ICLK2. The first timing signal PH1 is used to determine a timing in the first-half period of a cycle of the FD internal clock signal ICLK2. On the other hand, the second timing signal PH2 is used to determine a timing in the second-half period of that cycle of the FD internal clock signal ICLK2. In accordance with the first timing signal PH1 received as its clock input, a D-type flip-flop 54, which is a circuit means, latches the compare result signal CMP received and provides first-half period data DF. In accordance with the second timing signal PH2 received as its clock input, a D-type flip-flop 55, which is a circuit means, latches the first-half period data DF received and provides delayed first-half period data DDF. The D-type flip-flops 54 and 55 together form a data holding means operable to take in first data from the clock synchronous memory 20 at a time specified by the first timing signal PH1 and to hold and output the first data at a time specified by the second timing signal PH2. In accordance with the second timing signal PH2 received as its clock input, a D-type flip-flop 56, which is a circuit means, latches the compare result signal CMP received and provides second-half period data DL. The D-type flip-flop 56 forms a data taking-in means operable to take in second data from the clock synchronous memory 20 and to hold and output the second data, at a time specified by the second timing signal PH2. An EXOR circuit 57, which is a comparing means, receives the delayed first-half period data DDF and the second-half period data DL and provides a buffer control signal ENA representative of the exclusive OR of DDF and DL. A three-state output buffer 58 responds to the buffer control signal ENA by providing the delayed first-half period data DDF as received or by placing the output in a high impedance (Hi-Z) state.

Figure 4:
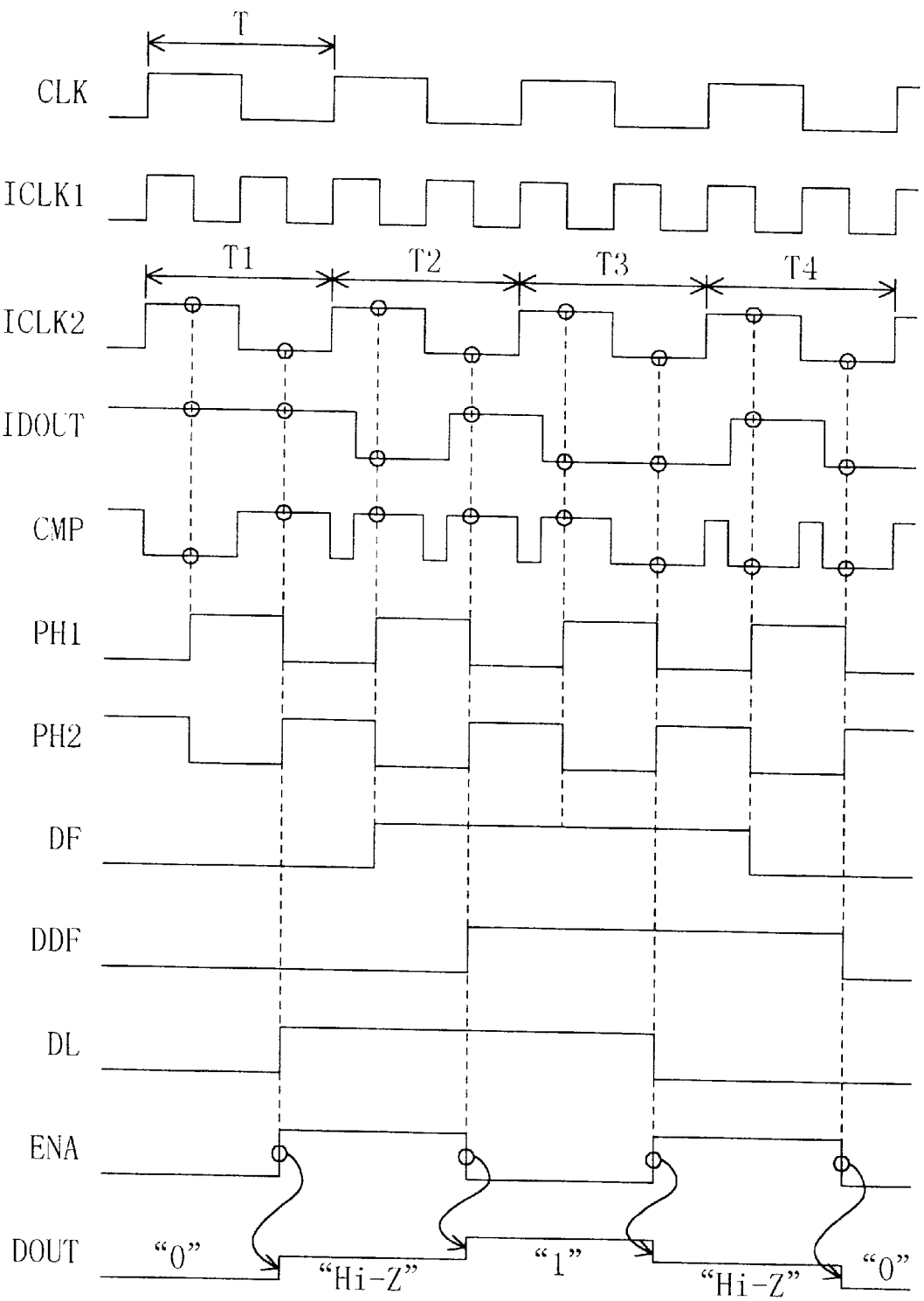
FIG. 4 is a timing chart diagram showing the operation of the data output converting circuit of FIG. 3.

Referring now to FIGS. 3 and 4, the operation of the data output converting circuit 50 is described. FIG. 4 is a timing chart diagram showing the operation of the data output converting circuit 50 of FIG. 3. The frequency-dividing circuit 51, with the aid of a toggle flip-flop or the like, frequency-divides the internal clock signal ICLK1, generated based on the external clock signal CLK and the delayed external clock signal DCLK (not shown in the figure), for generating the FD internal clock signal ICLK2. As shown in FIG. 4, the FD internal clock signal ICLK2 is identical in waveform with the external clock signal CLK. In some cases, the external clock signal CLK may be used in place of the FD internal clock signal ICLK2.

The EXOR circuit 52 receives the FD internal clock signal ICLK2 and the internal data output IDOUT and provides the compare result signal CMP. The compare result signal CMP assumes the low level LOW if there exists a match in level between ICLK2 and IDOUT. On the other hand, if there exists a mismatch in level between ICLK2 and IDOUT, the compare result signal CMP then assumes the high level HIGH. In other words, the compare result signal CMP is indicative of whether there exists a match or mismatch in level between the FD internal clock signal ICLK2 and the internal data output IDOUT at a predetermined point in time of the FD internal clock signal ICLK2. For example, similar to the case in which the internal clock signal ICLK1 varies repeating 0 and 1 in that order, if the internal data output IDOUT varies repeating 0 and 1 in that order for every one cycle of the internal clock signal ICLK1, the EXOR circuit 52 is always fed two identical inputs (in other words, there always exists a match between the two inputs of the EXOR circuit 52). As a result, the level of the compare result signal CMP is held constantly low (the low level LOW). Contrary to the case in which the internal clock signal ICLK1 varies repeating 0 and 1 in that order, if the internal data output IDOUT varies repeating 1 and 0 in that order for every one cycle of the internal clock signal ICLK1, the EXOR circuit 52 is always fed two different inputs (in other words, there always exists a mismatch between the two inputs of the EXOR circuit 52). As a result, the level of the compare result signal CMP is held constantly high (the high level HIGH).

The D-type flip-flop 54, which has been fed the first timing signal PH1 as its clock input, latches the compare result signal CMP in the first-half periods of each cycle of the FD internal clock signal ICLK2 (T1, T2, . . . , T4, and so on) and provides the first-half period data DF representative of whether there exists a match or mismatch in level between the FD internal clock signal ICLK2 and the internal data output IDOUT in the first-half periods of each ICLK2 cycle. Like the D-type flip-flop 54, the D-type flip-flop 56, which has been fed the second timing signal PH2 as its clock input, latches the compare result signal CMP in the second-half periods of each ICLK2 cycle (T1, T2, . . . , T4, and so on) and provides the second-half period data DL indicative of whether there exists a match or mismatch in level between the signal ICLK2 and the output IDOUT in the second-half periods of each ICLK2 cycle. For the purpose of comparing the first-half period data DF latched in the first-half periods of each ICLK2 cycle and the second-half period data DL latched in the second-half periods of each ICLK2 cycle, the D-type flip-flop 55 responds to the second timing signal PH2 by providing the delayed first-half period data DDF as a result of delaying the first-half period data DF.

The EXOR circuit 57 provides the buffer control signal ENA representative of the exclusive OR of the delayed first-half period data DDF and the second-half period data DL, accordingly, the first-half period data DF and the second-half period data DL are compared, with the first-half period data DF and the second-half period data DL matched in timing to each other. The three-state output buffer 58 places its output in a high impedance (Hi-Z) state if the buffer control signal ENA received is indicative of HIGH (disable). On the other hand, if the buffer control signal ENA received is indicative of LOW (enable), the three-state output buffer 58 places its output in a low impedance state to provide the as-received data DDF. The output of the three-state output buffer 58 is the external data output DOUT that is provided from the data output converting circuit 50.

FIG. 5 shows the relationship between the compare result of the FD clock signal ICLK2 with the internal data output IDOUT, and the external data output DOUT. As shown in FIG. 5, the external data output DOUT is 0 if there exists a match in level between the FD internal clock signal ICLK2 and the internal data output IDOUT in the first-half period of a cycle of the FD clock signal ICLK2 as well as in the second-half period thereof, as in the case of the cycle T4 in FIG. 4. On the other hand, the external data output DOUT is 1 if such a match exists neither in the first-half period nor in the second-half period, as in the case of the cycle T2 in FIG. 4. The external data output DOUT is placed in a high impedance (Hi-Z) state if there exists a match in the first-half period and if there exists a mismatch in the second-half period, as in the case of the cycle T1 of FIG. 4. Also, the external data output DOUT is placed in a high impedance (Hi-Z) state if there exists a mismatch in the first-half period and if there exists a match in the second-half period, as in the case of the cycle T3 of FIG. 4. The number of possible combinations of internal data states of the first- and second-half period portions of the FD internal clock signal ICLK2 is four. However, three types of states, namely, the state of 0, the state of 1, and the state of Hi-Z, are used as states assumable by the external data output DOUT. In the way described above, the internal data output IDOUT is converted into the external data output DOUT having a frequency one-half that of the internal data output IDOUT (in other words, the cycle of the external data output DOUT is twice that of the internal data output IDOUT). In addition, each of the condition in which there exists a match in the first-half period and there exists a mismatch in the second-half period and the condition in which there exists a mismatch in the first-half period and there exists a match in the second-half period is degenerated to a condition in which the external data output DOUT=Hi-Z.

A stripe pattern in a monitored burn-in system is considered as an example of a test pattern. A stripe pattern, in which the data repeats 0 and 1 for every two cycles, is written to and read from the clock synchronous memory 20. When the clock synchronous memory 20 operates normally, or when the internal data output IDOUT in synchronization with the internal clock signal ICLK1 is the same as an expected value prepared by the test system according to the stripe pattern, either the condition in which there exists a match in the first-half period as well as in the second-half period or the condition in which there exists a mismatch in the first-half period as well as in the second-half period always holds (see FIG. 5). Accordingly, the value of the external data output DOUT is maintained at a fixed value, i.e., at a value of 0 or at a value of 1. On the other hand, if the internal data output IDOUT assumes the 0 state in the first-half period as well as in the second-half period (as in the case of the cycle T3 of FIG. 4) or if the internal data output IDOUT assumes the 1 state in the first-half period as well as in the second-half period (as in the case of the cycle Ti of FIG. 4), the external data output DOUT is placed in a high impedance (H-Z) state, thereby making it possible to distinguish an operation failure occurring in the clock synchronous memory 20.

As described above, in accordance with the semiconductor device of FIG. 1, it is arranged such that the functional circuit, which operates by a high-frequency clock signal, gives output for two cycles in a corresponding manner in one cycle of a low-frequency clock signal, whereby the operation of the functional circuit can be tested by a slow test system. The functional circuit itself is operated by a high-frequency clock signal for testing. This provides a reduced test time, thereby providing reductions in test cost. Additionally, there is no need for the test system to provide a high-frequency clock signal, thereby providing reductions in test system cost.

In the above description, it is arranged for the test system to generate the delayed external clock signal DCLK which is delayed by one-fourth (¼) of a cycle with respect to the external clock signal CLK. Alternatively, it is possible to generate a clock signal with a delay in phase in the semiconductor device 10. The delay time of such a phase-delayed clock signal (which corresponds to the delayed external clock signal DCLK of FIG. 2) will exert effects only on the duty ratio of the internal clock signal ICLK1, not on the cycle thereof. Accordingly, the phase is not necessarily to be delayed by one-fourth of the cycle. In addition, the logic of the data output converting circuit 50 is not limited to the one shown in FIG. 5. It is possible to employ a circuit configured to give its output, only at two levels of HIGH and LOW without using a high impedance state. Further, it may be arranged such that the provision of the EXOR circuit 52 is omitted so as to directly send the internal data output IDOUT to the D-type flip-flops 54 and 56.

Figure 6:
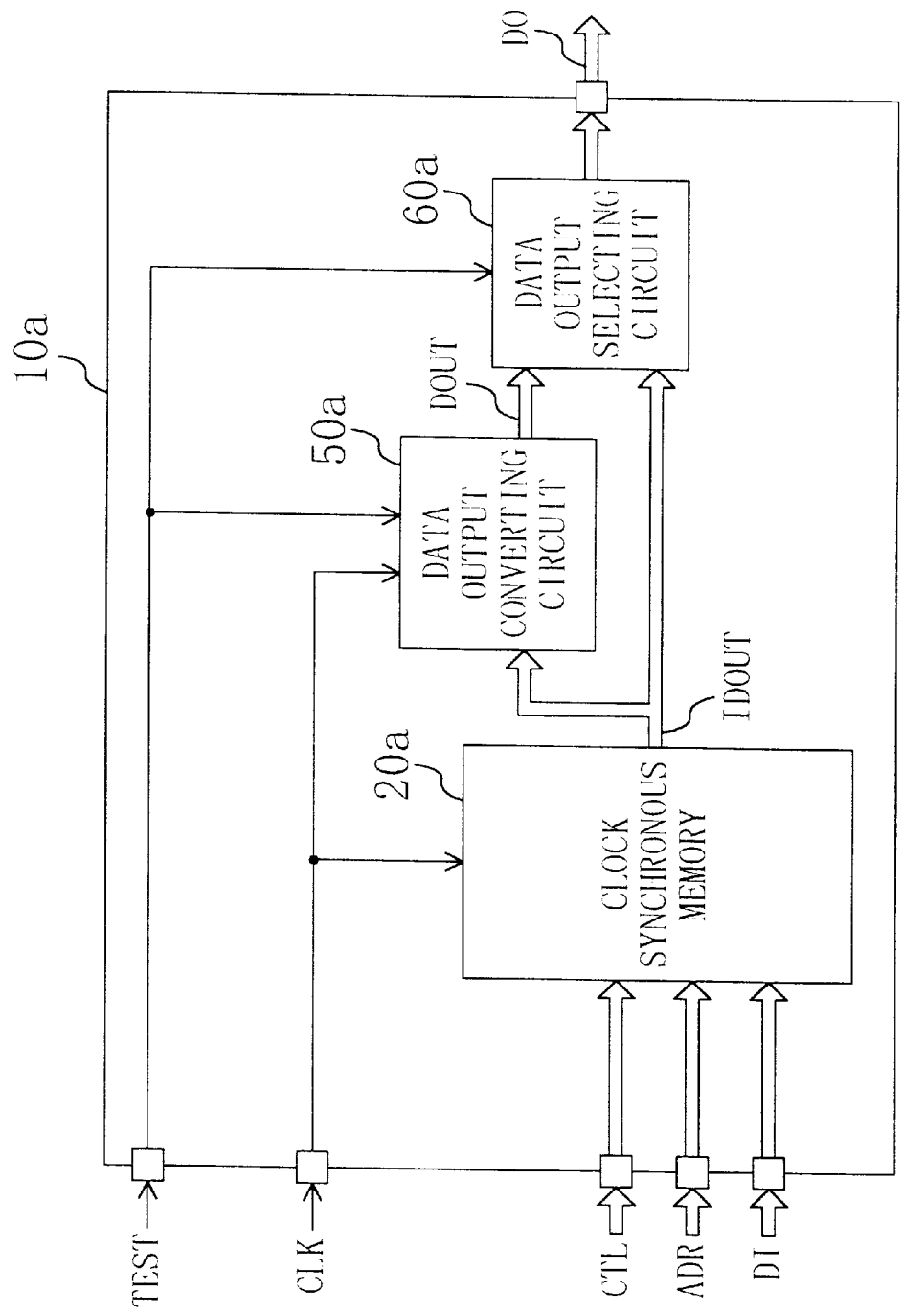
FIG. 6 is a block diagram showing another example structure of the semiconductor integrated circuit of the present invention.

FIG. 6 shows another example structure of the semiconductor integrated circuit (the semiconductor device) of the present invention. Referring to FIG. 6, there is shown a semiconductor device 10a having a clock synchronous memory 20a operable to perform a so-called DDR (double data rate) operation. The clock synchronous memory 20a, which is a functional circuit, receives from the outside of the device 10a the control signal CTL, the address signal ADR, the data input DI, and the external clock signal CLK, operates on the basis of the external information received (CTL, ADR, DI, and CLK), and provides the internal data output IDOUT in synchronization with both the rising and falling edges of the external clock signal CLK. A data output converting circuit 50a, which is a circuit means, responds to the test control signal TEST by converting the internal data output (two-valued logic signal) IDOUT which is variable at a predetermined variation frequency into the external data output (three-valued logic signal) DOUT which is variable at a less variation frequency than the two-valued logic signal. More specifically, based on the internal data output IDOUT provided from the clock synchronous memory 20a in synchronization with the external clock signal CLK, the data output converting circuit 50a generates the external data output DOUT in synchronization with the external clock signal CLK or in synchronization with a clock signal equivalent to the external clock signal CLK. A data output selecting circuit 60a, which is a circuit means, responds to the test control signal TEST by selecting between the external data output DOUT and the internal data output IDOUT and by providing, as the data output DO, either DOUT or IDOUT, whichever was selected, to the outside of the device 10a.

The operation of the semiconductor device 10a of FIG. 6 will be described. In the normal mode operation of the device 10a, the internal data output IDOUT, provided from the clock synchronous memory 20a in synchronization with the external clock signal CLK, is sent unaltered to the outside of the device 10a through the data output selecting circuit 60a, as the data output DO.

Figure 7:
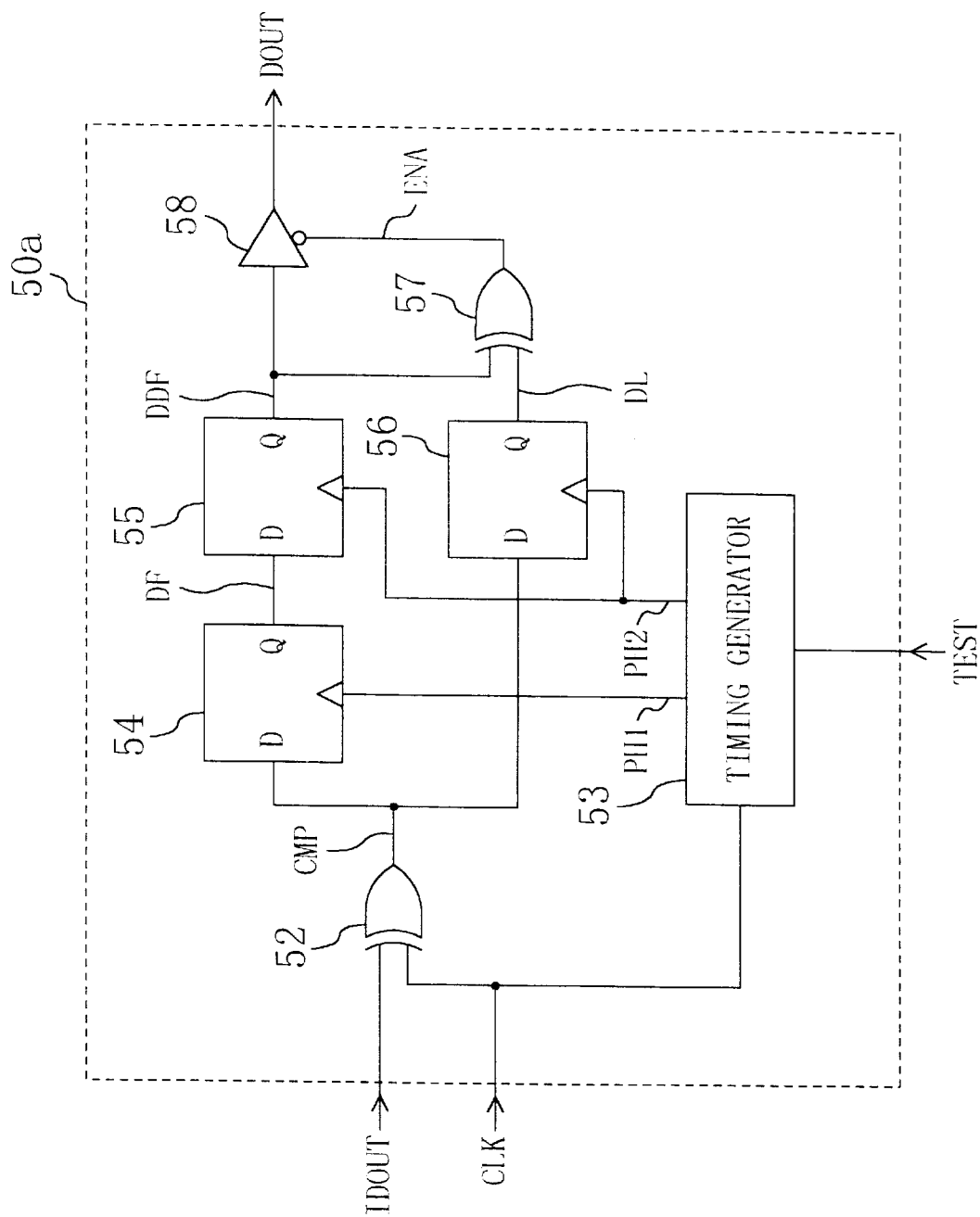
FIG. 7 is a circuit diagram showing in detail an example structure of a data output converting circuit of FIG. 6.
Figure 8:
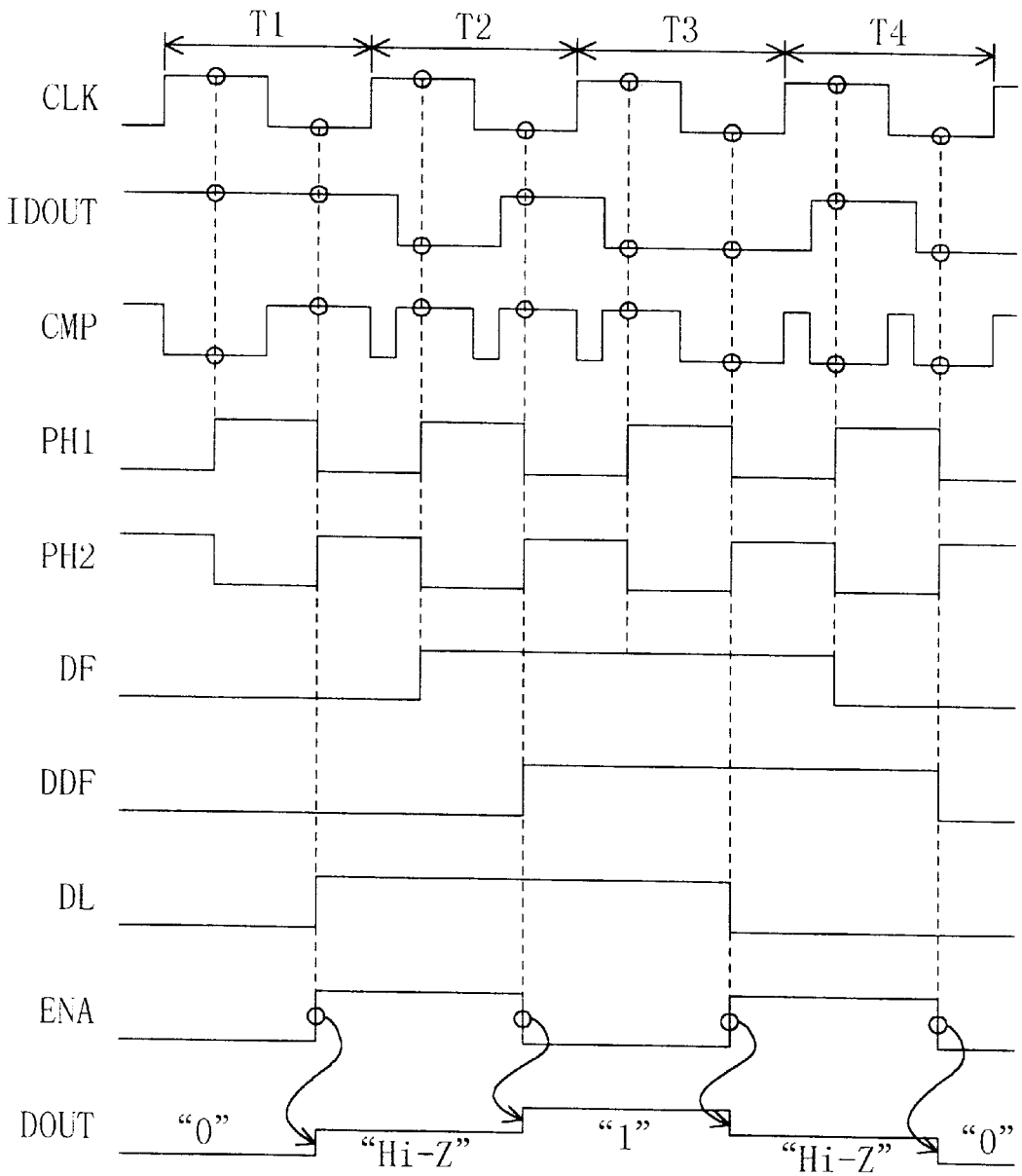
FIG. 8 is a timing chart diagram showing the operation of the data output converting circuit of FIG. 7.

Referring to FIGS. 6–8, the operation of the semiconductor device 10a is described in which a low-speed test system is used to perform testing of the semiconductor device 10a.

FIG. 7 shows in detail an example structure of the data output converting circuit 50a of FIG. 6. The EXOR circuit 52 of FIG. 7, which is a comparing means, provides the compare result signal CMP representative of the exclusive OR of the internal data output IDOUT and the external clock signal CLK. The timing generator 53, which is a circuit means, is controlled by the test control signal TEST and generates the first and second timing signals PH1 and PH2 which are delayed by respective predetermined lengths of time with respect to the external clock signal CLK. The first timing signal PH1 is used to determine a timing in the first-half period of a cycle of the external clock signal CLK. On the other hand, the second timing signal PH2 is used to determine a timing in the second-half period of that cycle of the external clock signal CLK. In accordance with the first timing signal PH1 received as its clock input, the D-type flip-flop 54, which is a circuit means, latches the compare result signal CMP received and provides the first-half period data DF. In accordance with the second timing signal PH2 received as its clock input, the D-type flip-flop 55, which is a circuit means, latches the first-half period data DF received and provides the delayed first-half period data DDF. These D-type flip-flops 54 and 55 together form a data holding means operable to take in first data from the clock synchronous memory 20a at a time specified by the first timing signal PH1 and to hold and output the first data at a time specified by the second timing signal PH2. In accordance with the second timing signal PH2 received as its clock input, the D-type flip-flop 56, which is a circuit means, latches the compare result signal CMP received and provides the second-half period data DL. The D-type flip-flop 56 forms a data taking-in means operable to take in second data from the clock synchronous memory 20a and to hold and output the second data, at a time specified by the second timing signal PH2. The EXOR circuit 57, which is a comparing means, receives the delayed first-half period data DDF and the second-half period data DL and provides the buffer control signal ENA representative of the exclusive OR of DDF and DL. The three-state output buffer 58 responds to the buffer control signal ENA by providing the delayed first-half period data DDF as received or by placing the output in a high impedance (Hi-Z) state.

Referring now to FIG. 8, the operation of the data output converting circuit 50a is described. FIG. 8 is a timing chart diagram useful in understanding the operation of the data output converting circuit 50a of FIG. 7. The EXOR circuit 52 receives the external clock signal CLK and the internal data output IDOUT and provides the compare result signal CMP. The compare result signal CMP assumes the low level LOW if there exists a match in level between the external clock signal CLK and the internal data output IDOUT. On the other hand, if there exists a mismatch in level between the external clock signal CLK and the internal data output IDOUT, the compare result signal CMP assumes the high level HIGH. In other words, the compare result signal CMP is indicative of whether there exists a match or mismatch in level between the external clock signal CLK and the internal data output IDOUT at a specified point in time of the external clock signal CLK.

The D-type flip-flop 54, which has been fed the timing signal PH1 as its clock input, latches the compare result signal CMP in the first-half periods of each cycle of the external clock signal CLK (T1, T2, . . . , T4, . . . , and so on) and provides the first-half period data DF representative of whether there exists a match or mismatch in level between the external clock signal CLK and the internal data output IDOUT in the first-half periods of each CLK cycle. Like the D-type flip-flop 54, the D-type flip-flop 56, which has been fed the timing signal PH2 as its clock input, latches the compare result signal CMP in the second-half periods of each CLK cycle (T1, T2, . . . , T4, . . . , and so on) and provides the second-half period data DL representative of whether there exists a match or mismatch in level between the external clock signal CLK and the internal data output IDOUT in the second-half periods of each CLK cycle. For the purpose of comparing the first-half period data DF latched in the first-half periods of each CLK cycle and the second-half period data DL latched in the second-half periods of each CLK cycle, the D-type flip-flop 55 responds to the second timing signal PH2 by providing the delayed first-half period data DDF as a result of delaying the first-half period data DF.

The EXOR circuit 57 provides the buffer control signal ENA representative of the exclusive OR of the delayed first-half period data DDF and the second-half period data DL, accordingly, the first-half period data DF and the second-half period data DL are compared, with the first-half period data DF and the second-half period data DL matched in timing to each other. The three-state output buffer 58 places its output in a high impedance (Hi-Z) state if the buffer control signal ENA received is indicative of HIGH (disable). On the other hand, if the buffer control signal ENA received is indicative of LOW (enable), the three-state output buffer 58 places its output in a low impedance state to provide the as-received data DDF. The output from the three-state output buffer 58 is the external data output DOUT that is provided from the data output converting circuit 50a.

In the semiconductor device of FIG. 6, data, which vary in synchronization with both the rising and falling edges of the external clock signal CLK, are output in the normal mode (DDR) operation, as has been described above. On the other hand, in the test mode operation, the variation frequency that output data vary is cut in half, thereby making it possible to perform testing of the functional circuit with a low-speed test system. This therefore provides reductions in test system cost.

It is possible to employ a circuit configured to give its output, only at two levels of HIGH and LOW without using a high impedance state. Further, it may be arranged such that the provision of the EXOR circuit 52 is omitted so as to directly send the internal data output IDOUT to the D-type flip-flops 54 and 56.

Although the invention described herein has been discussed in terms of a clock synchronous memory, it is equally applicable to other devices as long as they have a functional circuit operable to provide data in synchronization with a clock signal. Further, the present invention is applicable not only to device output monitoring by a monitored burn-in system but also to general functional testing.

What is claimed is:

1. A semiconductor integrated circuit comprising:
   (a) a functional circuit for providing, in synchronization with a clock signal, data at a first frequency;
   (b) data holding means for performing a data take-in/hold operation so that in a first period of cycles having said first frequency within one period of cycles having a second frequency lower than said first frequency, first data is taken in from said functional circuit and held in said data holding means;
   (c) data taking-in means for taking in, from said functional circuit, second data in a second period of said cycles having said first frequency posterior to said first period within said period of cycles having said second frequency; and
   (d) data output converting means for generating, based on said first data held in said data holding means and said second data taken in by said data taking-in means, third data and for providing said third data at said second frequency.

2. The semiconductor integrated circuit as defined in claim 1, wherein said data output converting means performs a data conversion operation so that the number of states assumable by said third data falls below the number of all possible combinations of states assumable by said first data and states assumable by said second data.

3. The semiconductor integrated circuit as defined in claim 1 further comprising data output selecting means for selecting, based on a test control signal received, between data provided from said functional circuit at said first frequency and said third data;
   wherein when said semiconductor integrated circuit operates normally, said data output selecting means selects and sends said data of said functional circuit to the outside of said semiconductor integrated circuit as a data output; and
   wherein when said semiconductor integrated circuit is tested, said data output selecting means selects and sends said third data to the outside of said semiconductor integrated circuit as a data output.

4. The semiconductor integrated circuit as defined in claim 1, wherein said functional circuit provides data in synchronization with both the rising and falling edges of said clock signal at a frequency twice that of said clock signal.

5. The semiconductor integrated circuit as defined in claim 4, wherein said second frequency is equal to that of said clock signal.

6. The semiconductor integrated circuit as defined in claim 1, wherein said data output converting means has comparing means for comparing said first data and said second data.

7. The semiconductor integrated circuit as defined in claim 1 further comprising:

(a) clock generating means for receiving an external clock signal from the outside of said semiconductor integrated circuit and for generating, based on said external clock signal received, an internal clock signal having said first frequency; and (b) clock selecting means for selecting, based on a test control signal received, between said internal clock signal and said external clock signal;

wherein when said semiconductor integrated circuit is tested, said clock selecting means selects and sends said internal clock signal to said functional circuit; and wherein when said semiconductor integrated circuit operates normally, said clock selecting means selects and sends said external clock signal to said functional circuit.

8. The semiconductor integrated circuit as defined in claim 7, said data output converting means having:

(a) frequency dividing means for frequency dividing said internal clock signal to generate a frequency-divided internal clock signal having said second frequency;

(b) first comparing means for making a comparison in logic value between data received from said functional circuit and said frequency-divided internal clock signal; and (c) second comparing means for making a comparison between an output from said first comparing means in said first cycle and another from said first comparing means in said second cycle.

9. The semiconductor integrated circuit as defined in claim 1, wherein said functional circuit is a clock synchronous memory.

* * * * *